United States Patent [19]

Lubbe et al.

[11] Patent Number: 5,247,734
[45] Date of Patent: Sep. 28, 1993

[54] METHOD AND APPARATUS OF AN IMPROVED HEAT SINK

[75] Inventors: John N. Lubbe; Lester J. Onyszko, both of Chicago; Raul Olivera, Hoffman Estates, all of Ill.

[73] Assignee: Motorola, Inc., Schaumburg, Ill.

[21] Appl. No.: 973,855

[22] Filed: Nov. 9, 1992

[51] Int. Cl.⁵ .............................. B23P 15/00
[52] U.S. Cl. ................ 29/890.045; 29/890.03; 29/525; 165/80.4
[58] Field of Search ........ 29/890.03, 890.045, 29/525, 428; 165/80.1, 80.4, 185

[56] References Cited

U.S. PATENT DOCUMENTS

| | | | |
|---|---|---|---|
| 3,372,453 | 3/1968 | Butt | 29/890.03 |
| 3,381,747 | 5/1968 | Darm | 29/890.03 |
| 4,879,891 | 11/1989 | Hinshaw | 165/80.4 |
| 4,884,331 | 12/1989 | Hinshaw | 29/890.03 |
| 4,901,416 | 2/1990 | McKinney | 29/890.045 |
| 5,014,776 | 5/1991 | Hess | 165/185 |
| 5,095,973 | 3/1992 | Toy | 29/890.03 |
| 5,150,831 | 9/1992 | Jordan et al. | 29/890.03 |

Primary Examiner—Irene Cuda
Attorney, Agent, or Firm—Timothy Markison; Steven G. Parmelee

[57] ABSTRACT

A first heat sink member with extension slots and component detailing is cast from a thermally conductive material. Fin members are constructed from a similar, but not necessarily identical, thermally conductive material. The fin members are constructed so that they will mate with the extension slots of the first heat sink member. Positioned in alignment with the extension slots to the first heat sink member, the fin members are attached with a thermally conductive bonding agent.

12 Claims, 1 Drawing Sheet

METHOD AND APPARATUS OF AN IMPROVED HEAT SINK

FIELD OF THE INVENTION

This invention relates generally to heat sinking apparatus and, in particular, to an improved heat sink apparatus and fabrication thereof.

BACKGROUND OF THE INVENTION

As is generally known, heat sinking apparatus aid in the cooling of power devices. Such power devices, if not heat sinked, would over heat, damaging the device. As is also known, there are a variety of heat sinking apparatus such as cast heat sinks, heat sink extrusions, and milled heat sinking structures.

Each of the heat sinks offers certain advantages and disadvantages. For example, cast heat sinks are customized to accommodate detailing for unique component layouts and RF shielding, thus providing a designer with a great degree of design flexibility. However, cast heat sinks have limited use due to a height-to-width ratio for the fins of approximately 4. In addition, cast heat sinks are limited by their relatively large weight and low heat dissipation ability. Extruded heat sinks offer better heat dissipation than cast heat sinks, but are constrained by the fixed nature of their structure. Due to this fixed structure, the addition of layout detailing and RF shielding structures to an extruded heat sink is often difficult, reducing their design flexibility. Milled heat sinks typically comprise a milled aluminum block with separately affixed fins. By attaching the fins separately, the milled heat sink's heat dissipation is better than that of a cast heat sink due to an improved height-to-width ratio of the fins. However, the cost of milling the fin slots and the component layout details into the heat sink are prohibitive. Also, the RF shielding added to milled and extruded heat sinks is less effective than that designed into cast heat sinks. Therefore, a need exists for a heat sink method and apparatus which combines the advantages of cast, extruded and milled heat sinks, without many of their disadvantages.

DESCRIPTION OF A PREFERRED EMBODIMENT

Figure 1:
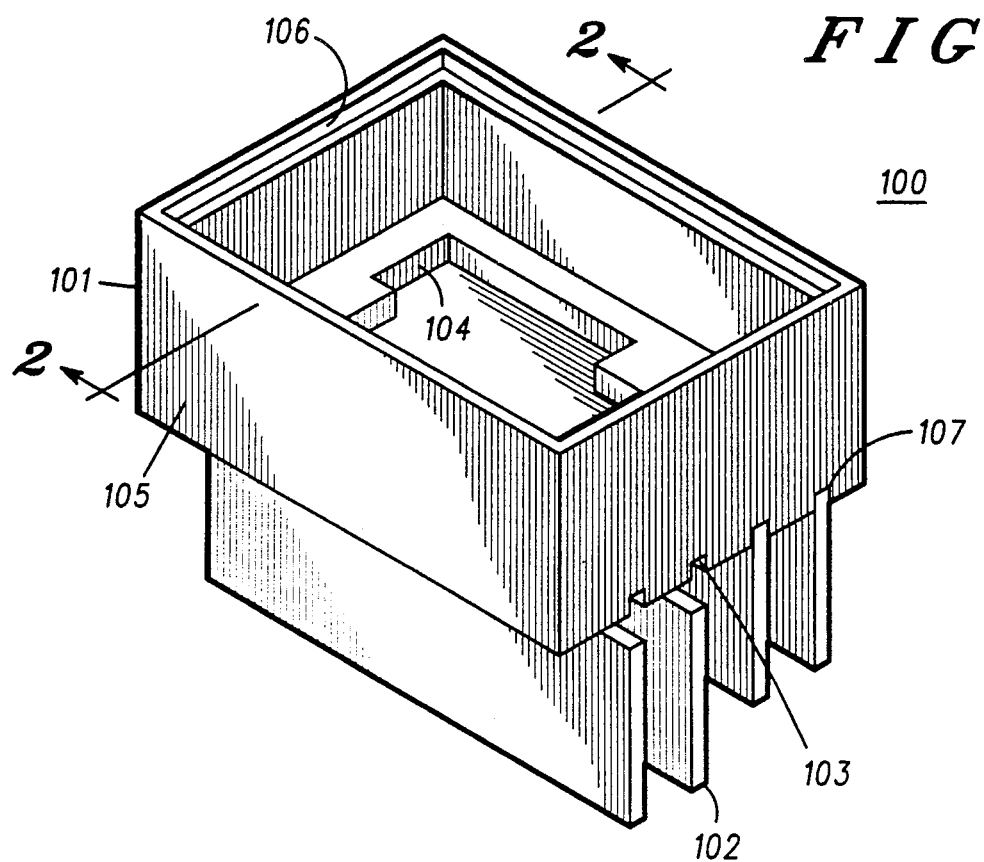
FIG. 1 illustrates a heat sinking apparatus in accordance with the present invention.

FIG. 1 illustrates a heat sinking apparatus 100 that comprises a first heat sink member 101, fin members 102, extension slots 103, component detail 104, RF shield housing 105, lid receptacle recess area 106, and a thermally conductive bonding agent 107. The heat sink apparatus 100 is comprised of at least one thermally conductive material such as aluminum or copper. Further, the first heat sink member 101 and fin members 102 may be fabricated from the same or different thermally conductive materials. The choice of these materials should take into consideration the different expansion and contraction properties required by the application. The thermally conductive bonding agent 107 may comprise a thermally conductive epoxy, or welding. The component detail 104 may comprise a unique pattern casted into the first heat sink member 101 within the area circumscribed by the radio frequency housing 105. The component detail 104 allows power devices with unique contours to be mounted within the first heat sink member 101 (rather than on the surface).

The first heat sink member 101 is casted to include the extension slots 103, the component detail 104, and the radio frequency housing 105. The fin members 102 are casted or forged with dimensions in accordance with those of extension slots 103. Each fin member 102 is positioned in alignment with a corresponding extension slot 103 and subsequently joined with the correspond extension slot 103 using the thermally conductive bonding agent 107. It is understood that the extension slots 103 could be forged into the first heat sink member 101 producing similar results. It is further understood that a mechanical means, such as press fitting, could be used in place of the thermally conductive bonding agent 107.

Figure 2:
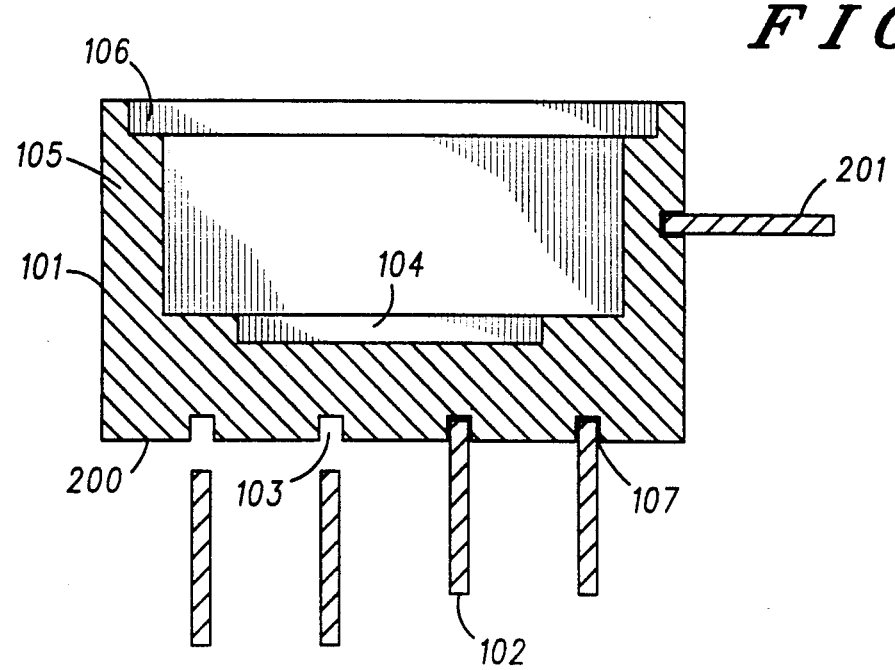
FIG. 2 illustrates a cross-sectional view of a heat sinking apparatus in accordance with the present invention.

FIG. 2 illustrates a cross-sectional view of the heat sinking apparatus comprising the first heat sink member 101, fin members 102, extension slots 103, component detail 104, RF shield housing 105, lid receptacle recess area 106, thermally conductive bonding agent 107, major surface 200, and alternative major surface and fin orientation 201. From the alternative major surface and fin orientation 201, it is understood that the fin members 102 can be placed on any of a number of major surfaces dependent upon the application. It is also understood that the orientation of the fin members 102 may be parallel, perpendicular, or at an angle to the primary axis of the major surface to which they are attached, dependent upon the application.

This technique of constructing a heat sinking apparatus 100 combines the advantages of cast heat sinks with those of extruded and milled heat sinks, while minimizing their inherent disadvantages. Heat sinks constructed in this manner are able to achieve an improved height-to-spacing width ratio of approximately 12, which results in better heat dissipation capabilities. A significant reduction in weight and cost is also realized. Additionally, the inclusion of RF housing in the cast eliminates the need to mechanically attach such housing to a milled or extruded heat sink, as is often the case in prior art. This results in better RF shielding performance. As an example, a prior art 8"×17" cast heat sink weighing 45 pounds at a cost of approximately $75 is able to dissipate 170 watts. In comparison, a heat sink constructed in accordance with the present invention having dimensions of 8"×12" and weighing 8.5 pounds at a cost of $45 is able to dissipate up to 250 watts.

We claim:

1. A method for fabricating a heat sinking apparatus, the method comprising the steps of:
   a) a casting, from a thermally conductive material, a first heat sink member that includes at least a plurality of extension slots on a major surface of the first heat sink member;
   b) fabricating, from the thermally conductive material, a plurality of fin members;
   c) positioning each of the plurality of fin members with a corresponding slot of the plurality of extension slots; and
   d) thermally adhering the each of the plurality of fin members to the first heat sink member in alignment with the corresponding slot of the plurality of extension slots.

2. In the method of claim 1, step (a) further comprising casting a radio frequency housing on the first heat sink member.

3. In the method of claim 1, step (a) further comprising casting a component detail on the first heat sink member.

4. In the method of claim 1, step (d) further comprising adhering, with thermal epoxy, each of the fin members to the corresponding slot of the plurality of slots.

5. In the method of claim 1, step (d) further comprising adhering, by welding, each of the fin members to the corresponding slot of the plurality of slots.

6. In the method of claim 1, step (d) further comprising adhering, by press fitting, each of the fin members to the corresponding slot of the plurality of slots.

7. A method for fabricating a heat sinking apparatus, the method comprising the steps of:
   a) casting, from a first thermally conductive material, a first heat sink member that includes at least a plurality of extension slots on a major surface of the first heat sink member;
   b) fabricating, from a second thermally conductive material, a plurality of fin members;
   c) positioning each of the plurality of fin members with a corresponding slot of the plurality of extension slots; and
   d) thermally adhering the each of the plurality of fin members to the first heat sink member in alignment with the corresponding slot of the plurality of extension slots.

8. In the method of claim 7, step (a) further comprising casting a radio frequency housing on the first heat sink member.

9. In the method of claim 7, step (a) further comprising casting a component detail on the first heat sink member.

10. In the method of claim 7, step (d) further comprising adhering, with thermal epoxy, each of the fin members to the corresponding slot of the plurality of slots.

11. In the method of claim 7, step (d) further comprising adhering, by welding, each of the fin members to the corresponding slot of the plurality of slots.

12. In the method of claim 7, step (d) further comprising adhering, by press fitting, each of the fin members to the corresponding slot of the plurality of slots.

* * * * *